(12) United States Patent
Kim et al.

(10) Patent No.: US 10,825,763 B2
(45) Date of Patent: Nov. 3, 2020

(54) POWER MODULE OF DOUBLE-FACED COOLING

(71) Applicants: HYUNDAI MOTOR COMPANY, Seoul (KR); KIA MOTORS CORPORATION, Seoul (KR)

(72) Inventors: Young Seok Kim, Seongnam-si (KR); Kyoung Kook Hong, Hwaseong-si (KR)

(73) Assignees: Hyundai Motor Company, Seoul (KR); Kia Motors Corporation, Seoul (KR)

(*) Notice: Subject to any disclaimer, the term of this patent is extended or adjusted under 35 U.S.C. 154(b) by 0 days.

(21) Appl. No.: 16/387,979

(22) Filed: Apr. 18, 2019

(65) Prior Publication Data

US 2020/0135629 A1    Apr. 30, 2020

(30) Foreign Application Priority Data

Oct. 24, 2018  (KR) .................. 10-2018-0127165

(51) Int. Cl.
*H01L 23/498*  (2006.01)
*H01L 23/495*  (2006.01)

(52) U.S. Cl.
CPC .. *H01L 23/49811* (2013.01); *H01L 23/49833* (2013.01); *H01L 23/49838* (2013.01); *H01L 23/49861* (2013.01); *H01L 23/49568* (2013.01)

(58) Field of Classification Search
CPC ......... H01L 23/49811; H01L 23/49833; H01L 23/49838; H01L 23/528; H01L 23/538; H01L 23/5286; H01L 23/5386
See application file for complete search history.

(56) References Cited

U.S. PATENT DOCUMENTS 9,941,234 B2    4/2018 Liang
2009/0140414 A1*  6/2009 Soyano .................. H01L 24/37
                                                257/698
2012/0314372 A1   12/2012 Hauenstein

FOREIGN PATENT DOCUMENTS

| KR | 10-2018-0030298 A | 3/2018 |
|---|---|---|
| KR | 10-2018-0069944 A | 6/2018 |
| KR | 10-2018-0087330 A | 8/2018 |
| WO | 2017/112863 A1 | 6/2017 |

* cited by examiner

*Primary Examiner* — Matthew E. Gordon
(74) *Attorney, Agent, or Firm* — Morgan, Lewis & Bockius LLP

(57) ABSTRACT

A power module of double-faced cooling includes: an upper substrate; a lower substrate on which a plurality of semiconductor chips are disposed; and a first spacer disposed between the upper substrate and the lower substrate, electrically connecting the upper substrate and the lower substrate to each other, and disposed on the lower substrate to be equally distanced from each of the semiconductor chips. Power is supplied to the semiconductor chips on the lower substrate through the upper substrate and the first spacer.

9 Claims, 7 Drawing Sheets

-PRIOR ART-

POWER MODULE OF DOUBLE-FACED COOLING

CROSS REFERENCE TO RELATED APPLICATION

The present application claims priority of Korean Patent Application No. 10-2018-0127165 filed in the Korean Intellectual Property Office on Oct. 24, 2018, the entire contents of which are incorporated herein for all purposes by this reference.

TECHNICAL FIELD

The present disclosure relates to a power module of double-faced cooling and, more particularly, a power module of double-faced cooling that improves balance of a current that is applied to a plurality of semiconductor chips disposed between an upper substrate and a lower substrate.

BACKGROUND

An inverter has attracted attention due to its ability to drive eco-friendly vehicles (hybrid vehicles and electric vehicles). A power module is one of the parts accounting for the largest portion of the cost of manufacturing an inverter, and therefore, a numerous researches have been conducted with the goal of increasing the power, decreasing the size, and reducing manufacturing costs. Further, power modules of double-faced cooling have been actively studied to reduce the sizes of power modules and improve the cooling efficiency of power modules.

Power modules of double-faced cooling include a plurality of semiconductor chips between an upper substrate and a lower substrate and are configured such that heat from the semiconductor chips is removed by a cooler disposed outside the two substrates, whereby it is possible to reduce the size of such power modules and improve cooling efficiency.

However, according to the power modules of double-faced cooling for power conversion in the related art in which a plurality of chips are disposed between an upper substrate and a lower substrate, the chips can be damaged by non-uniformity of currents that are applied to the chips. The capacities of single chips have been increased in existing power modules using Si IGBT to solve this problem. However, the above method for Si cannot be applied to next-generation semiconductors, for example, made of Sic or GaN.

Accordingly, it is necessary to develop a technology that can improve the uniformity of currents among a plurality of chips in a power module of double-faced cooling including a plurality of chips.

SUMMARY

The present disclosure has been made in order to solve the above-mentioned problems with the prior art and an aspect of the present disclosure is to provide a power module of double-faced cooling in which the uniformity of currents that are applied to a plurality of semiconductor chips can be improved by disposing spacers, which electrically connect an upper substrate and a lower substrate to each other, between the upper substrate and the lower substrate at positions the same distance from the semiconductor chips on the lower substrate.

In accordance with an aspect of the present disclosure, a power module of double-faced cooling includes: an upper substrate; a lower substrate on which a plurality of semiconductor chips are disposed; and a first spacer disposed between the upper substrate and the lower substrate, electrically connecting the upper substrate and the lower substrate to each other, and disposed on the lower substrate to be equally distanced from each of the semiconductor chips, wherein power is supplied to the semiconductor chips on the lower substrate through the upper substrate and the first spacer.

The power module of double-faced may further include a second spacer disposed between the upper substrate and the lower substrate, electrically connecting the upper substrate and the lower substrate to each other, and disposed on the lower substrate to be equally distanced from each of the semiconductor chips.

A positive terminal that is connected to an anode of a battery, a negative terminal that is connected to a cathode of the battery, and an output terminal that outputs power that is provided through the semiconductor chips may be disposed on the lower substrate.

The lower substrate may have: a first pattern connected with the positive terminal; a second pattern connected with the negative terminal; and a third pattern connected with the output terminal The power module of double-faced cooling may further include: a third spacer disposed between the upper substrate and the lower substrate, electrically connecting the upper substrate and the lower substrate to each other, and connected to the first pattern; a fourth spacer disposed between the upper substrate and the lower substrate, electrically connecting the upper substrate and the lower substrate to each other, and connected to the second pattern; and a plurality of fifth spacers disposed between the semiconductor chips and the upper substrate and electrically connecting the semiconductor chips and the upper substrate to each other.

The upper substrate may have: a fourth pattern connected with the third spacer; and a fifth pattern connected with the second spacer and the fifth spacers.

The fourth pattern may be connected with the first spacer.

The upper substrate may further have a sixth pattern connected with the fourth spacer and the fifth spacers.

The fifth pattern may allow currents transmitted from the semiconductor chips through the fifth spacers to be combined at a specific position.

The sixth pattern may allow currents transmitted from the semiconductor chips through the fifth spacers to be combined at a specific position.

The first spacer may allow a current transmitted through the upper substrate to be uniformly applied to the semiconductor chips on the lower substrate.

The second spacer may allow a current transmitted through the upper substrate to be uniformly applied to the semiconductor chips on the lower substrate.

According to the present disclosure, by placing spacers, which electrically connect an upper substrate and a lower substrate to each other, between the upper substrate and the lower substrate at positions the same distance from the semiconductor chips on the lower substrate, it is possible to improve the balance of densities of currents applied to the semiconductor chips. Accordingly, it is further possible to prevent specific semiconductor chips from being damaged by concentration of current in the semiconductor chips.

BRIEF DESCRIPTION OF THE DRAWINGS

The above and other aspects, features and advantages of the present disclosure will be more apparent from the following detailed description taken in conjunction with the accompanying drawings, in which.

DETAILED DESCRIPTION OF THE EXEMPLARY EMBODIMENTS

A power module of double-faced cooling according to an embodiment of the present disclosure is described hereafter with reference to the accompanying drawings.

Figure 1:
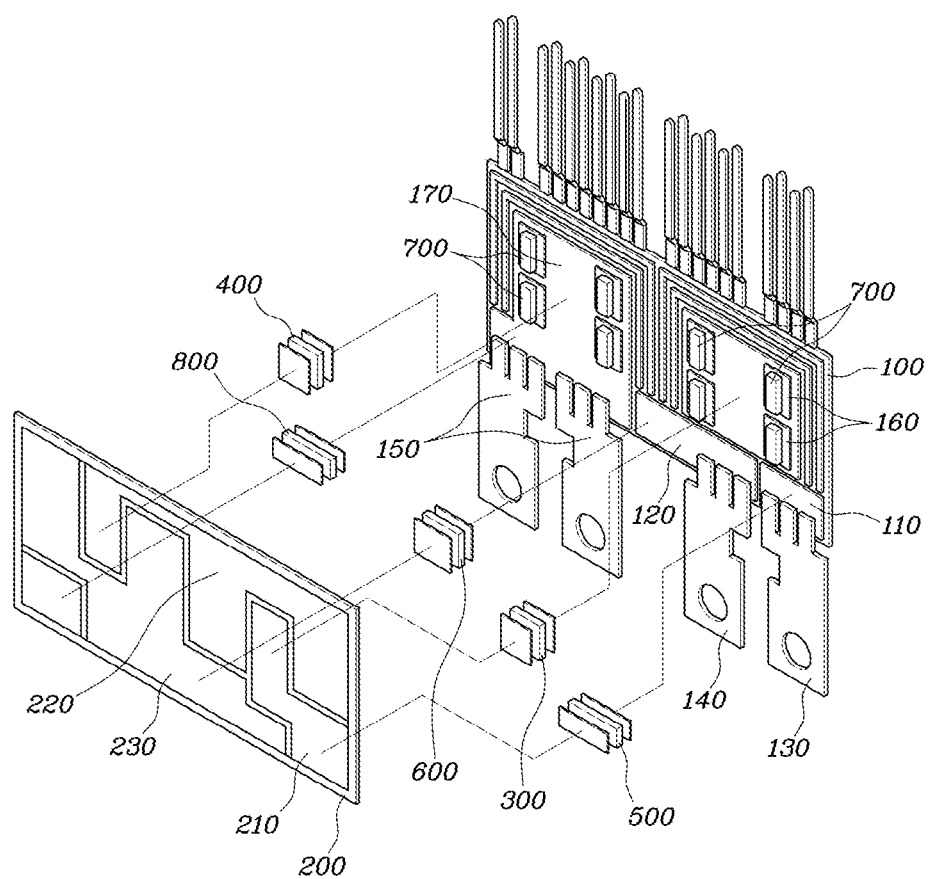
FIG. 1 is an exploded perspective view of a power module of double-faced cooling according to an embodiment of the present disclosure.
Figure 2:
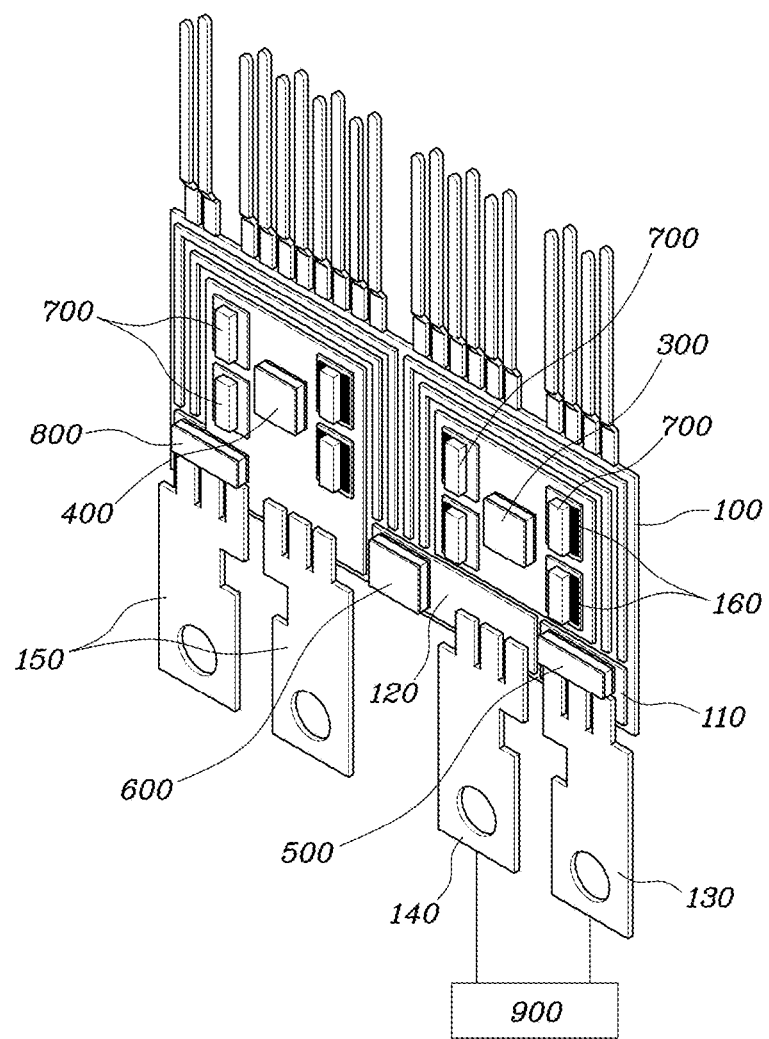
FIG. 2 is a view showing the power module of double-faced cooling according to an embodiment of the present disclosure with an upper substrate removed.
Figure 3:
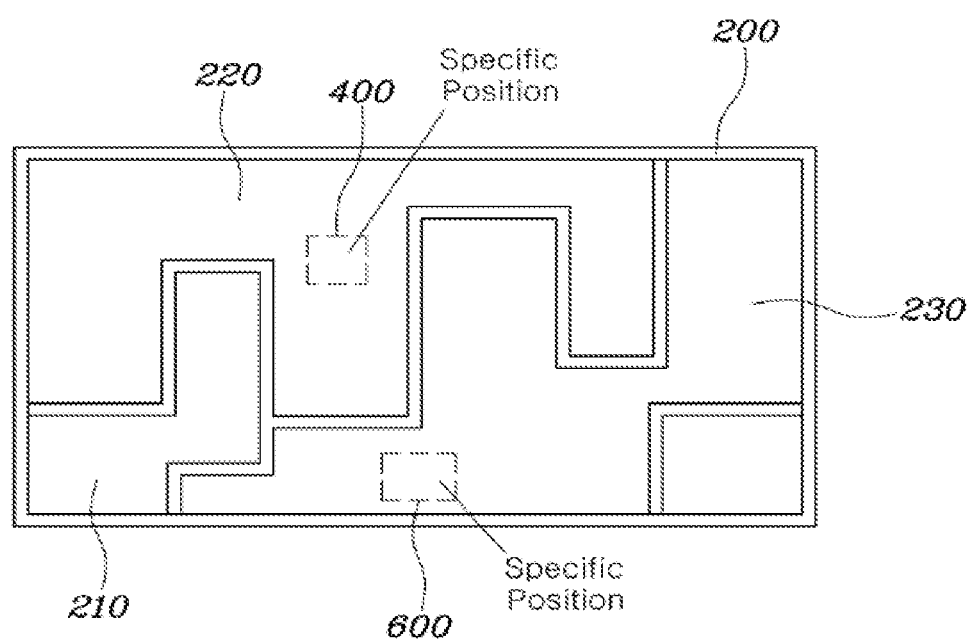
FIG. 3 is a view showing patterns of the upper substrate of the power module of double-faced cooling according to an embodiment of the present disclosure.
Figure 4:
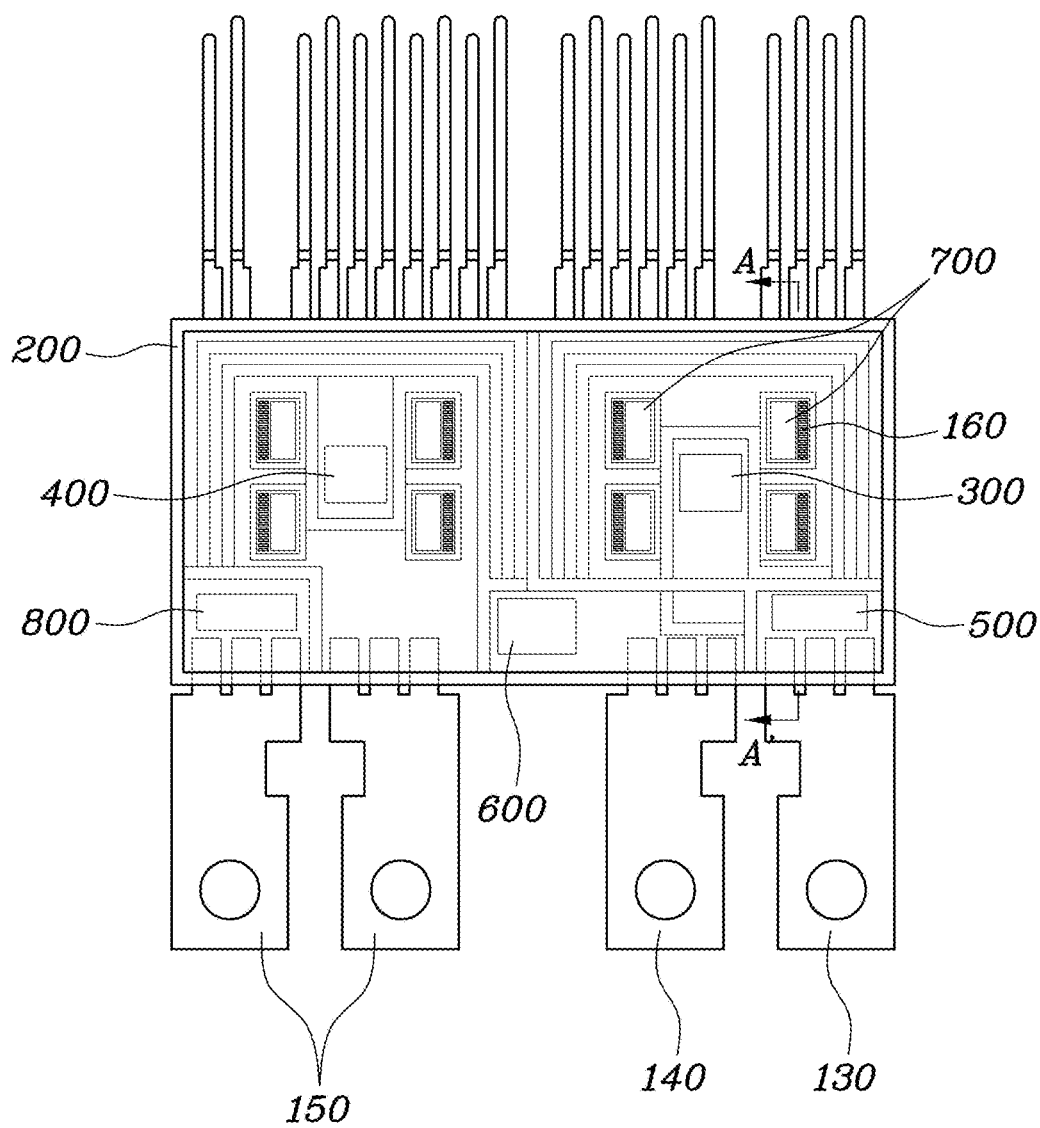
FIG. 4 is a view showing the flow of current in the power module of double-faced cooling according to an embodiment of the present disclosure.
Figure 5:
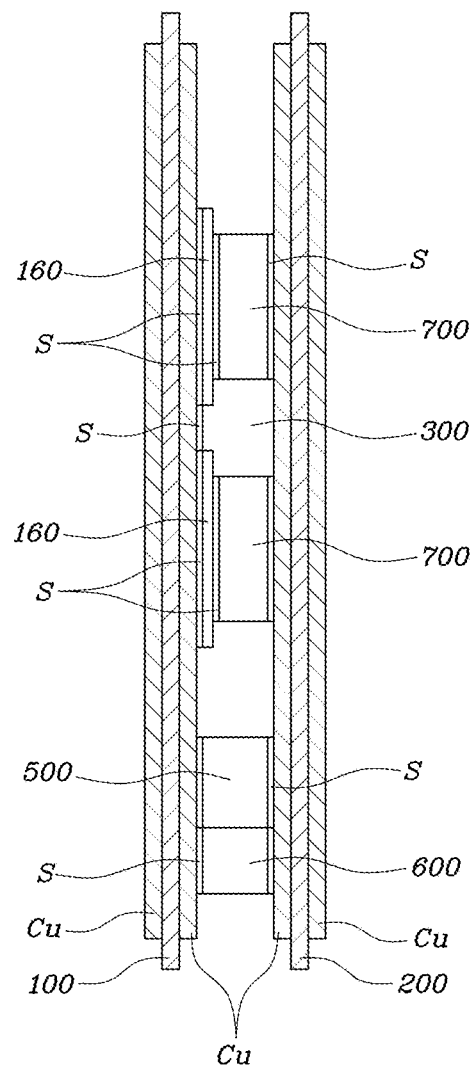
FIG. 5 is a cross-sectional view taken along line A-A' of FIG. 4.

FIG. 1 is an exploded perspective view of a power module of double-faced cooling according to an embodiment of the present disclosure, FIG. 2 is a view showing the power module of double-faced cooling according to an embodiment of the present disclosure with an upper substrate removed, FIG. 3 is a view showing patterns of the upper substrate of the power module of double-faced cooling according to an embodiment of the present disclosure, FIG. 4 is a view showing the flow of current in the power module of double-faced cooling according to an embodiment of the present disclosure, and FIG. 5 is a cross-sectional view taken along line A-A' of FIG. 4.

A power module of double-faced cooling according to an embodiment of the present disclosure, as shown in FIGS. 1 to 3, may include: an upper substrate 200, a lower substrate 100 on which a plurality of semiconductor chips 160 are disposed; and a first spacer 300 disposed between the upper substrate 200 and the lower substrate 100, electrically connecting the upper substrate 200 and the lower substrate 100 to each other, and positioned the same distance from the semiconductor chips 160 on the lower substrate 100, and may further include a second spacer 400 disposed between the upper substrate 200 and the lower substrate 100, electrically connecting the upper substrate 200 and the lower substrate 100 to each other, and positioned the same distance from the semiconductor chips 160 on the lower substrate 100. The first spacer 300 and the second spacer 400 may be made of conductive materials to electrically connect the upper substrate 200 and the lower substrate 100 to each other.

According to an embodiment, when four semiconductor chips 160 are symmetrically or circumferentially arranged on the lower substrate 100, as shown in FIG. 2, the first spacer 300 and the second spacer 400 may be positioned at the center of the space surrounded by the semiconductor chip 160, in which the distances from the first spacer 300 to the semiconductor chips 160 may be the same and the distances from the second spacer 400 to the semiconductor chips 160 may be the same.

As described above, since the first spacer 300 and the second spacer 400 are disposed at positions having the same distance from the semiconductor chips 160 on the lower substrate 100 in the power module of double-faced cooling according to the present disclosure, a current transmitted through the upper substrate 200 is uniformly applied to the semiconductor chips on the lower substrate 100, so that the current difference among the semiconductor chips can be reduced. Accordingly, it is possible to prevent specific semiconductor chips from being damaged by concentration of current in the semiconductor chips.

In detail, a positive terminal 130 that is connected to an anode of a battery 900, a negative terminal 140 that is connected to a cathode of the battery 900, and an output terminal 150 that outputs power that is provided through the semiconductor chips 160 may be formed at the lower substrate 100. Depending on embodiments, the output terminal 150 may be connected to a motor, etc.

The lower substrate 100 may have a first pattern 110 connected to the positive terminal 130, a second pattern 120 connected to the negative terminal 140, and a third pattern 170 connected to the output terminal 150. The first pattern 110, the second pattern 120, and the third pattern 170 formed at the lower substrate 100 and patterns formed on the upper substrate 200 to be described below are made of electrically conductive materials, so that they can be passages of currents that flow in the lower substrate 100 and the upper substrate 200. In other words, a current input from the battery 900 through the positive terminal 130 can flow through the first pattern 110, a current flowing through the second pattern 120 can be discharged through the negative terminal 140, and a current can be output to the output terminal 150 through the third pattern 170.

The power module of double-faced cooling according to the present disclosure may further include a third spacer 500 and a fourth spacer 600 that are disposed between the upper substrate 200 and the lower substrate 100 and electrically connect the upper substrate 200 and the lower substrate 100 to each other. The third spacer 500 and the fourth spacer 600 may be made of conductive materials to electrically connect the upper substrate 200 and the lower substrate 100 to each other. The third spacer 500 is connected with the first pattern 110 connected with the positive terminal 130 and the fourth spacer 400 is connected with the second pattern 120 connected with the negative terminal 140.

The power module of double-faced cooling may further include a plurality of fifth spacers 700 disposed between the semiconductor chips 160 and the upper substrate 200 and electrically connecting the semiconductor chips 160 and the upper substrate 200 to each other. The fifth spacers 700 may be made of a conductive material to electrically connect the upper substrate 200 and the semiconductor chips 160 to each other.

The upper substrate 200 may include a fourth pattern 210 connected with the third spacer 500 and a fifth pattern 220 connected with the second spacer 400 and the fifth spacers 500. The fourth pattern 210 is connected with the first spacer 300. The substrate 200 may further have a sixth pattern 230 connected with the fourth spacer 600 and the fifth spacers 700.

The fifth pattern 220 on the upper substrate 200 may be formed such that currents transmitted from the semiconductor chips 160 through the fifth spacers 700 join into one at a specific point. The sixth pattern 230 on the upper substrate 200 may also be formed such that currents transmitted from the semiconductor chips 160 through the fifth spacers 700 join into one at a specific point.

The structure of the power module of double-faced cooling according to the present disclosure is described in detail with reference to FIG. 5. The power module of double-faced cooling according to the present disclosure may have a layered structure in which the semiconductor chips 160 and the spacers 300, 400, 500, 600, and 800 are disposed between the lower substrate 100 and the upper substrate 200. In detail, depending on embodiments, the upper substrate 200 and the lower substrate 100 may be made of conductive metallic materials including copper, as shown in FIG. 5, and a copper material may be layered on the top and the bottom of the substrates with a ceramic substrate therebetween. The spacers 300, 400, 500, 600, and 800 between the upper substrate 200 and the lower substrate 100 may be soldered (S) to the bottom of the upper substrate 200 and the top of the lower substrate 100. The bottoms of the semiconductor chips 160 may be soldered (S) to the top of the lower substrate 100, the tops of the semiconductor chips 160 may be soldered (S) to the bottoms of the fifth spacers 700, and the tops of the fifth spacers 700 may be soldered (S) to the bottom of the upper substrate 200.

The flow of currents in the power module of double-faced cooling is described hereafter with reference to FIGS. 1 to 4 on the basis of the detailed configuration and characteristics of the power module of double-faced cooling.

First, a current input from the battery 900 through the positive terminal 130 of the lower substrate 100 can flow to the upper substrate 200 through the third spacer 500 connected with the first pattern 110. Further, the current flowing through the upper substrate 200 flows to the lower substrate 100 through the first spacer 300. Accordingly, currents are uniformly applied to the semiconductor chips 160 on the lower substrate 100. Currents converted through the semiconductor chips 160 flow to the upper substrate 200 through the fifth spacers 700 between the semiconductor chips 160 and the upper substrate 200, flow to the second spacer 400 through the fifth pattern 220, and then flow to the lower substrate 100 through the second spacer 400, so currents uniformly flow to the semiconductor chips 160 on the lower substrate 100. The currents converted through the semiconductor chips 160 flows to the upper substrate 200 through the fifth spacers 700 between the semiconductor chips 160 and the upper substrate 200 and flows to the fourth spacer 600 through the sixth pattern 230. The currents flow to the lower substrate 100 through the fourth spacer 600, flow to the second pattern 120 connected with the fourth spacer 600, and are then discharged through the negative terminal 140 connected to the second pattern 120. Alternating currents generated by the semiconductor chips 160 can be output through the third pattern 170 and the output terminal 150.

Figure 6:
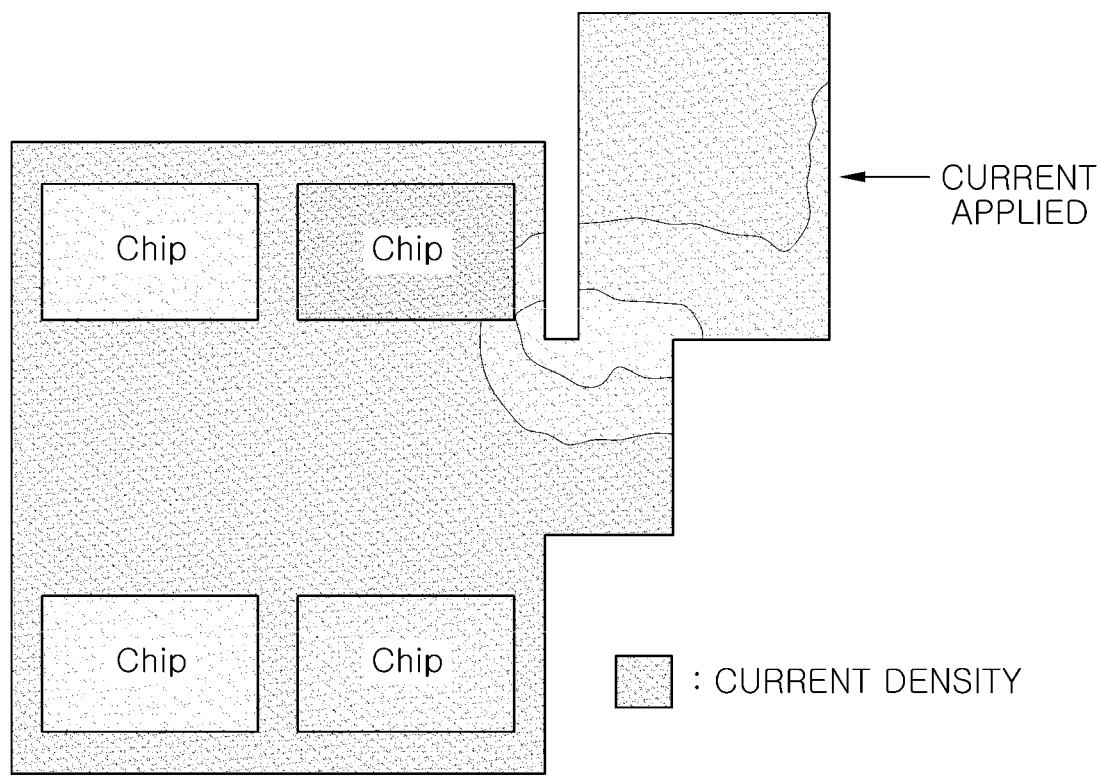
FIG. 6 is a view showing the current density of each semiconductor chip in a power module of double-faced cooling of the related art.
Figure 7:
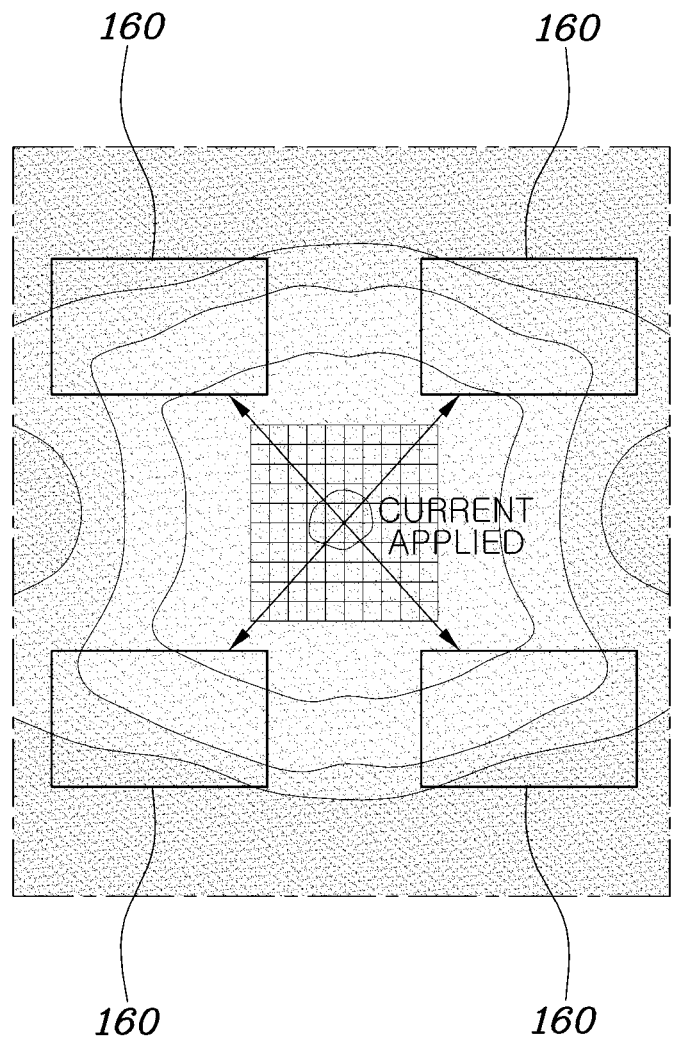
FIG. 7 is a view showing the current density of each semiconductor chip in the power module of double-faced cooling according to an embodiment of the present disclosure.

FIG. 6 is a view showing the current density of each semiconductor chip in a power module of double-faced cooling of the related art, and FIG. 7 is a view showing the current density of each semiconductor chip in the power module of double-faced cooling according to an embodiment of the present disclosure.

According to power modules of double-faced cooling in the related art, it can be seen that, as shown in FIG. 6, when a current is applied from a power supply such as a battery, the current concentrates in semiconductor chips close to the power supply and is not supplied well to semiconductor chips far from the power supply, so that there is a large difference in current density in the chips. As described above, according to power modules of double-faced cooling in the related art, a current concentrates only in semiconductor chips close to a power supply of a plurality of semiconductor chips on a substrate and is not uniformly applied to the other semiconductor chips, so that the semiconductor chips in which the current concentrates are damaged.

In order to solve this problem, in the present disclosure, a current input through the positive terminal 130 of the battery 900 can be guided to the upper substrate 200 through the third spacer 500 and can be then guide to the lower substrate 100 through the first spacer 300 and the second spacer 400 each positioned the same distance from the semiconductor chips 160, so that currents are uniformly applied to the semiconductor chips 160. According to the present disclosure, since currents are applied to the semiconductor chips 160 through the first spacer 300 and the second spacer 400 each positioned the same distance from the semiconductor chips 160, it is possible to make current densities in the chips uniform, as shown in FIG. 7. Therefore, it is possible to solve the problem that specific semiconductor chips are damaged by the concentration of a current in the semiconductor chips.

What is claimed is:

1. A power module of double-faced cooling, comprising:
   an upper substrate;
   a lower substrate on which a plurality of semiconductor chips are disposed;
   a first spacer arranged between the upper substrate and the lower substrate, electrically connecting the upper substrate and the lower substrate to each other, and arranged on the lower substrate to be equally distanced from each of a first plurality of semiconductor chips, and arranged radially inwardly of the first plurality of semiconductor chips;
   a second spacer arranged between the upper substrate and the lower substrate, electrically connecting the upper substrate and the lower substrate to each other, arranged on the lower substrate to be equally spaced apart from each of a second plurality of semiconductor chips and to be symmetric to the first spacer, and arranged radially inwardly of the second plurality of semiconductor chips,
   a third spacer arranged between the upper substrate and the lower substrate and electrically connecting the upper substrate and the lower substrate to each other, wherein the third spacer is connected to a first pattern;
   a fourth spacer arranged between the upper substrate and the lower substrate and electrically connecting the upper substrate and the lower substrate to each other, wherein the fourth spacer is connected to a second pattern; and
   a plurality of fifth spacers arranged between the plurality of semiconductor chips and the upper substrate, wherein the plurality of fifth spacers electrically connect the plurality of semiconductor chips and the upper substrate to each other,
   wherein power is supplied to the first plurality of semiconductor chips and the second plurality of semiconductor chips on the lower substrate through the upper substrate, the first spacer and the second spacer, and
   wherein the lower substrate includes:
      a positive terminal connected to an anode of a battery;
      a negative terminal connected to a cathode of the battery;
      an output terminal outputting power received from the plurality of semiconductor chips;
      the first pattern connected with the positive terminal;

the second pattern connected with the negative terminal; and
a third pattern connected with the output terminal, and
wherein the upper substrate includes:
a fourth pattern connected with the third spacer; and
a fifth pattern connected with the second spacer and the plurality of fifth spacers.

2. The power module of claim 1, wherein the fourth pattern is connected with the first spacer.

3. The power module of claim 1, wherein the upper substrate further has a sixth pattern connected with the fourth spacer and the plurality of fifth spacers.

4. The power module of claim 1, wherein the fifth pattern allows currents transmitted from the first plurality of semiconductor chips through the plurality of fifth spacers to be combined at a specific position.

5. The power module of claim 3, wherein the sixth pattern allows currents transmitted from the second plurality of semiconductor chips through the plurality of fifth spacers to be combined at a specific position.

6. The power module of claim 1, wherein the first spacer allows a current transmitted through the upper substrate to be uniformly applied to the first plurality of semiconductor chips on the lower substrate.

7. The power module of claim 1, wherein the second spacer allows a current transmitted through the upper substrate to be uniformly applied to the second plurality of semiconductor chips on the lower substrate.

8. A power module of double-faced cooling, comprising:
an upper substrate;
a lower substrate on which a plurality of semiconductor chips are physically and electrically connected to each other;
a first spacer arranged between the upper substrate and the lower substrate, electrically connecting the upper substrate and the lower substrate to each other, and arranged at a position between a first plurality of semiconductor chips to apply the same current to the first plurality of semiconductor chips on the lower substrate, and arranged radially inwardly of the first plurality of semiconductor chips;
a second spacer arranged between the upper substrate and the lower substrate, electrically connecting the upper substrate and the lower substrate to each other, arranged at a position between a second plurality of semiconductor chips to apply the same current to the second plurality of semiconductor chips on the lower substrate, and arranged radially inwardly of the second plurality of semiconductor chips;
a third spacer arranged between the upper substrate and the lower substrate, electrically connecting the upper substrate and the lower substrate to each other, and connected to a first pattern;
a fourth spacer arranged between the upper substrate and the lower substrate, electrically connecting the upper substrate and the lower substrate to each other, and connected to a second pattern; and
a plurality of fifth spacers arranged between the plurality of semiconductor chips and the upper substrate, and electrically connecting the plurality of semiconductor chips and the upper substrate to each other,
wherein power is supplied to the first plurality of semiconductor chips and the second plurality of semiconductor chips on the lower substrate through the upper substrate, the first spacer and the second spacer, and
wherein the lower substrate includes:
a positive terminal connected to an anode of a battery;
a negative terminal connected to a cathode of the battery;
an output terminal outputting power that is provided through the plurality of semiconductor chips;
the first pattern connected with the positive terminal;
the second pattern connected with the negative terminal; and
a third pattern connected with the output terminal, and
wherein the upper substrate includes:
a fourth pattern connected with the third spacer; and
a fifth pattern connected with the second spacer and the plurality of fifth spacers.

9. The power module of claim 8, wherein the first plurality of semiconductor chips and the second plurality of semiconductor chips are at least two or more semiconductor chips arranged symmetrically to each other.

* * * * *